United States Patent
Ohnishi

(10) Patent No.: US 8,742,376 B2
(45) Date of Patent: Jun. 3, 2014

(54) METHOD AND APPARATUS OF MASK DRAWING USING A GROUNDING BODY AT LOWEST RESISTANCE VALUE POSITION OF THE MASK

(71) Applicant: NuFlare Technology, Inc., Numazu (JP)

(72) Inventor: Takayuki Ohnishi, Numazu (JP)

(73) Assignee: NuFlare Technology, Inc., Numazu-shi (JP)

( * ) Notice: Subject to any disclaimer, the term of this patent is extended or adjusted under 35 U.S.C. 154(b) by 0 days.

(21) Appl. No.: 13/904,434

(22) Filed: May 29, 2013

(65) Prior Publication Data

US 2014/0001380 A1    Jan. 2, 2014

(30) Foreign Application Priority Data

Jul. 2, 2012    (JP) ................ 2012-148275

(51) Int. Cl.
| | | |
|---|---|---|
| H01L 21/027 | (2006.01) | |
| G03F 7/20 | (2006.01) | |
| H01J 37/317 | (2006.01) | |
| G03F 1/40 | (2012.01) | |

(52) U.S. Cl.
CPC .............. *H01L 21/027* (2013.01); *G03F 7/20* (2013.01); *H01J 37/3174* (2013.01); *G03F 1/40* (2013.01)
USPC .............. 250/492.22; 250/492.23; 250/492.3; 250/397; 250/310; 250/515.1; 257/621

(58) Field of Classification Search
CPC ........... H01L 21/027; G03F 1/40; G03F 1/78; G03F 1/144; G03F 7/20; G01R 27/2617; G01R 31/305
USPC ............ 250/310, 397, 492.22, 492.23, 492.3, 250/515.1; 257/621
See application file for complete search history.

(56) References Cited

U.S. PATENT DOCUMENTS

| | | | | |
|---|---|---|---|---|
| 7,608,528 | B2 * | 10/2009 | Tachikawa ................... | 438/487 |
| 7,922,501 | B2 * | 4/2011 | Yamanaka et al. ............. | 439/95 |
| 2003/0183764 | A1 * | 10/2003 | Bigarre et al. ................ | 250/310 |
| 2006/0124866 | A1 * | 6/2006 | Hisatsugu .................. | 250/492.2 |
| 2007/0228525 | A1 * | 10/2007 | Yamanaka et al. ............ | 257/621 |
| 2008/0054195 | A1 * | 3/2008 | Tachikawa ............... | 250/492.22 |
| 2010/0133433 | A1 * | 6/2010 | Tanimoto et al. ............ | 250/310 |
| 2011/0155930 | A1 * | 6/2011 | Kawaguchi et al. ..... | 250/492.22 |
| 2014/0001380 | A1 * | 1/2014 | Ohnishi .................... | 250/492.3 |

FOREIGN PATENT DOCUMENTS

| | | |
|---|---|---|
| JP | 2-125607 | 5/1990 |
| JP | 2010-74046 | 4/2010 |
| JP | 2010-190985 | 9/2010 |

* cited by examiner

*Primary Examiner* — David A Vanore
(74) *Attorney, Agent, or Firm* — Oblon, Spivak, McClelland, Maier & Neustadt, L.L.P.

(57) ABSTRACT

A mask drawing method includes: disposing a grounding body provided with a grounding pin at a plurality of different places on a mask substrate to measure resistance values; disposing the grounding body at a position where the resistance value is lowest, among the plural positions where the resistance values are measured; and irradiating an electron beam to the mask substrate to draw a desired pattern.

5 Claims, 6 Drawing Sheets

FIG. 5

| ANGLE | RESISTANCE VALUE (kΩ) |
|---|---|
| 0° | 46 |
| 90° | 40 |
| 180° | 48 |
| 270° | 45 |

FIG. 6

| NUMBER (n) | RESISTANCE VALUE (kΩ) |
|---|---|
| 1 | 46 |
| 2 | 86 |
| 3 | 48 |
| 4 | 45 |
| 5 | 79 |

METHOD AND APPARATUS OF MASK DRAWING USING A GROUNDING BODY AT LOWEST RESISTANCE VALUE POSITION OF THE MASK

CROSS REFERENCE TO RELATED APPLICATION

This application is based upon and claims the benefit of priority from the prior Japanese Patent Application No. 2012-148275, filed on Jul. 2, 2012; the entire contents of which are incorporated herein by reference.

FIELD

Embodiments of the present invention relate generally to a mask drawing method and a mask drawing apparatus.

BACKGROUND

A mask drawing apparatus is an apparatus to draw a desired pattern by irradiating an electron beam to a mask substrate (blank) comprising a substrate (mainly glass substrate) and a light shielding film (for example, chromium (Cr)) formed on the substrate. A resist film is formed on a surface of the mask substrate, and to draw the desired pattern, the resist film is exposed to the electron beam.

The mask substrate is grounded at the time of the drawing by the electron beam. This is because without the mask substrate being grounded, electric charges accumulate on the mask substrate due to the electron beam to bend a trajectory of the electron beam or to cause a blur due to the diffusion of the electron beam. It is impossible to draw a desired pattern on the mask substrate when the bending of the trajectory of the electron beam or the blur of the electron beam is occurred.

Because of this, in the mask drawing apparatus, at the time of the drawing by the electron beam, a grounding body is set on the mask substrate. Because the electric charges accumulating on the mask substrate due to the electron beam are discharged via the grounding body, the charging of the mask substrate can be prevented.

However, it is known that an unexpected increase of a contact resistance value between the grounding body and the mask substrate (hereinafter, referred to as a resistance value) sometimes occurs. Further, when the grounding body is set on the mask substrate, the resistance value sometimes differs depending on the direction in which the grounding body is set. There are various possible factors that cause such phenomenon, and a possible factor is, for example, that the grounding body does not reach a light shielding film of the mask substrate. If the drawing by the electron beam is performed in such a case, the electric charges accumulate on the mask substrate to bend the trajectory of the electron beam or to blur the electron beam. As a result, it is impossible to draw a desired pattern on the mask substrate. Therefore, there have conventionally been proposed various methods that can reduce the resistance value between the grounding body and the mask substrate.

BRIEF DESCRIPTION OF THE DRAWINGS

FIG. 5 is table data stored in a memory according to the first embodiment.

FIG. 6 is table data stored in a memory according to a modification example of the first embodiment.

DETAILED DESCRIPTION

Hereinafter, embodiments will be described with reference to the drawings.

First Embodiment

Figure 1A:
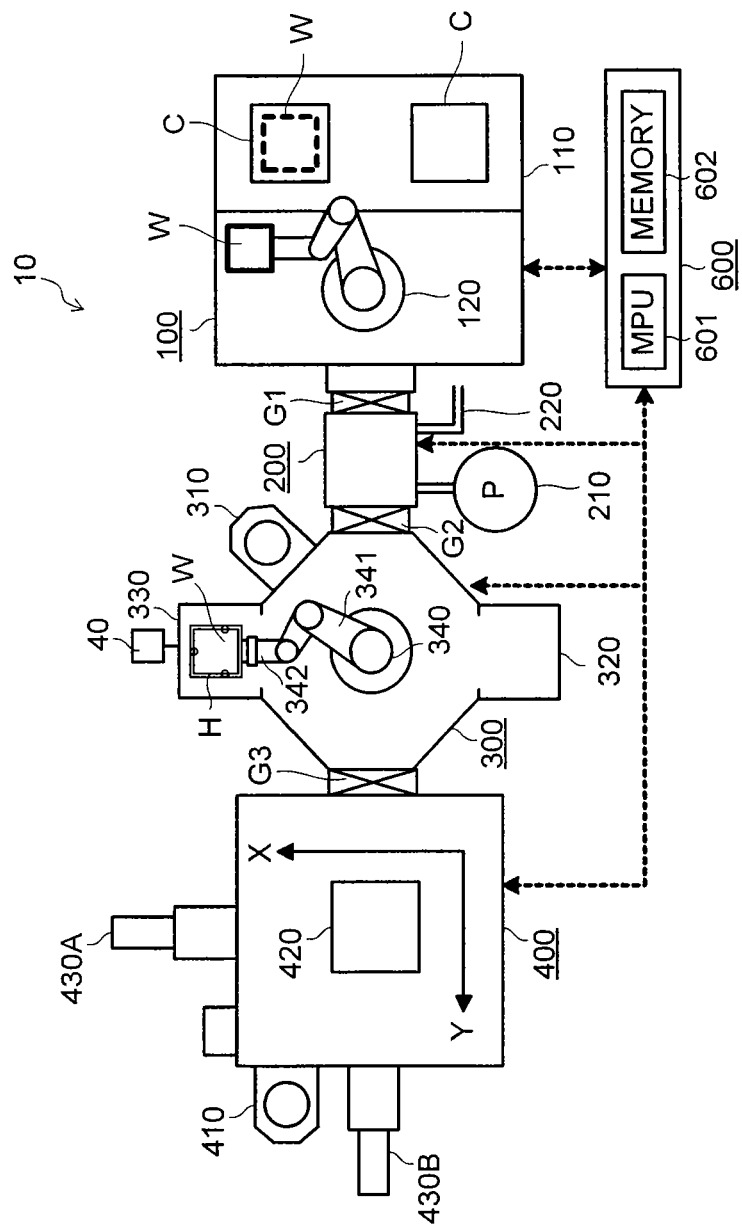
FIG. 1A and FIG. 1B are schematic diagrams of a mask drawing apparatus according to a first embodiment.
Figure 1B:
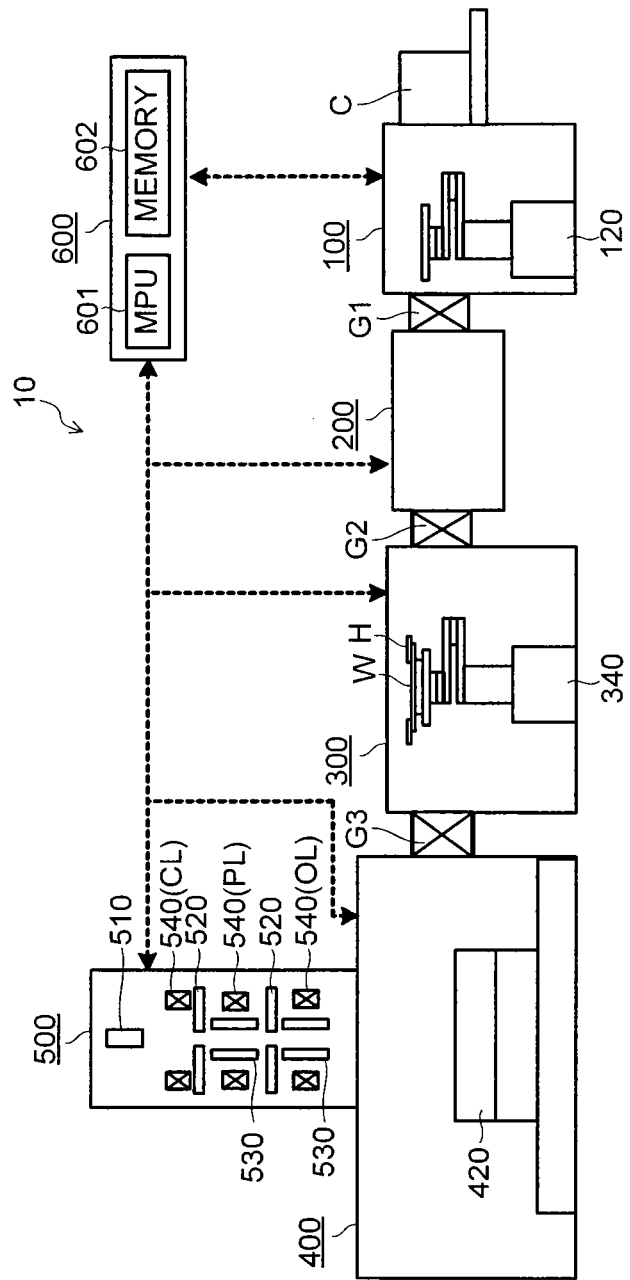

FIG. 1A is a schematic plane diagram of a mask drawing apparatus 10. FIG. 1B is a schematic sectional view of the mask drawing apparatus 10. Hereinafter, the structure of the mask drawing apparatus 10 will be described with reference to FIG. 1A and FIG. 1B. Note that an electron beam column 500 is not illustrated in FIG. 1A.

As shown in FIG. 1A and FIG. 1B, the mask drawing apparatus 10 includes an interface (I/F) 100, an input/output (I/O) chamber 200, a robot chamber (R chamber) 300, a writing chamber (W chamber) 400, the electron beam column 500, a control mechanism 600, and gate valves G1 to G3. Note that the robot chamber (R chamber) 300 constitutes a transfer chamber. Further the chain lines in FIG. 1A and FIG. 1B represent flows of control signals, data, and so on.

The I/F 100 includes a mounting table 110 where to place containers C (for example, SMIFPods) each housing a mask substrate W and a transfer robot 120 which transfers the mask substrate W.

The I/O chamber 200 is what is called a load lock chamber via which the mask substrate W is loaded/unloaded while an air pressure in the R chamber 300 is kept vacuum low. The I/O chamber 200 is provided with the gate valve G1 between itself and the I/F 100 and includes a vacuum pump 210 and a gas supply system 220. The vacuum pump 210 is, for example, a dry pump, a turbo molecular pump, or the like and it evacuates the inside of the I/O chamber 200. The gas supply system 220 supplies vent gas (for example, nitrogen gas or clean dry air (CDA)) into the I/O chamber 200 when setting the inside of the I/O chamber 200 to an atmospheric pressure.

When evacuating the inside of the I/O chamber 200, the vacuum pump 210 connected to the I/O chamber 200 is used for the evacuation. Further, when the inside of the I/O chamber 200 is returned to the atmospheric pressure, the vent gas is supplied from the gas supply system 220 to set the inside of the I/O chamber 200 to the atmospheric pressure. Note that when the inside of the I/O chamber 200 is set to vacuum or the atmospheric pressure, the gate valves G1, G2 are closed.

The R chamber 300 includes a vacuum pump 310, an alignment chamber 320, a grounding body housing chamber 330, and a transfer robot 340. The R chamber 300 is connected to the I/O chamber 200 via the gate valve G2.

The vacuum pump 310 is, for example, a Cryo pump, a turbo molecular pump, or the like. The vacuum pump 310 is connected to the R chamber 300 and evacuates the inside of the R chamber 300 to keep it highly vacuum. The alignment chamber 320 is a chamber where to align the mask substrate W.

The grounding body housing chamber 330 houses a grounding body H for grounding the mask substrate W. The grounding body housing chamber 330 is provided with a resistance measuring mechanism 40 which measures a contact resistance value between the grounding body H and the mask substrate W (hereinafter, simply referred to as a resistance value) while the grounding body H is set on the mask substrate W. The resistance measuring mechanism 40 will be described later with reference to FIG. 4.

The transfer robot 340 includes an arm 341 and an end effector 342 provided at an end of the arm 341. The transfer robot 340 transfers the mask substrate W to/from the I/O chamber 200, the alignment chamber 320, the grounding body housing chamber 330, and the W chamber 400.

The W chamber 400 includes a vacuum pump 410, an X-Y stage 420, drive mechanisms 430A, 430B and is connected to the R chamber 300 via the gate valve G3.

The vacuum pump 410 is, for example, a Cryo pump, a turbo molecular pump, or the like. The vacuum pump 410 is connected to the W chamber 400 and evacuates the inside of the W chamber 400 to keep it highly vacuum. The X-Y stage 420 is a table where to place the mask substrate W. The drive mechanism 430A drives the X-Y stage 420 in an X direction. The drive mechanism 430B drives the X-Y stage 420 in a Y direction.

The electron beam column 500 includes an electron beam irradiator which comprising an electron gun 510, apertures 520, deflectors 530, lenses 540 (condenser lens (CL), shaping lens (SL), objective lens (OL)), and so on. And the electron beam column 500 irradiates the electron beam to the mask substrate W placed on the X-Y stage 420.

The control mechanism 600 is, for example, a computer or the like and includes a MPU 601, a memory 602 (for example, solid state drive (SSD), hard disk drive (HDD)), and so on. The control mechanism 600 controls the operation of the mask drawing apparatus 10.

(Structure of Grounding Body H)

Figure 2A:
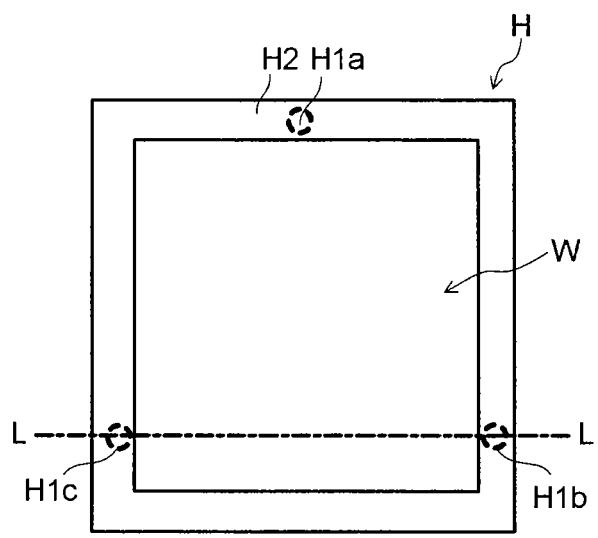
FIG. 2A and FIG. 2B are schematic views of a grounding body housing chamber according to the first embodiment.
Figure 2B:
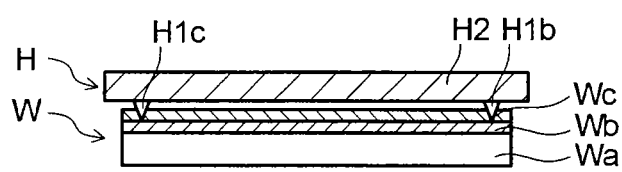

FIG. 2A is a plane view of the grounding body H. FIG. 2B is a cross-sectional view taken along the L-L in FIG. 2A. Note that FIGS. 2A and 2B show the grounding body H set on the mask substrate W.

As shown in FIG. 2A and FIG. 2B, the grounding body H includes three conductive grounding pins H1a to H1c and a conductive frame H2 in a frame shape. Note that the grounding pin H1b or H1c is provided on the frame H2 via an insulator. Further, the mask substrate W has a structure in which a light shielding film Wb (for example, chromium (Cr)) and a resist film Wc are stacked on a glass substrate Wa.

When the grounding body H is set on the mask substrate W, the grounding pins H1a to H1c of the grounding body H pierce through the resist film Wc due to their own weights to come into contact with the light shielding film Wb being a conductor. Consequently, the electric charges accumulating on the mask substrate W due to the irradiation of the electron beam are discharged via the grounding body H.

(Structure of Grounding Body Housing Chamber 330)

Figure 3A:
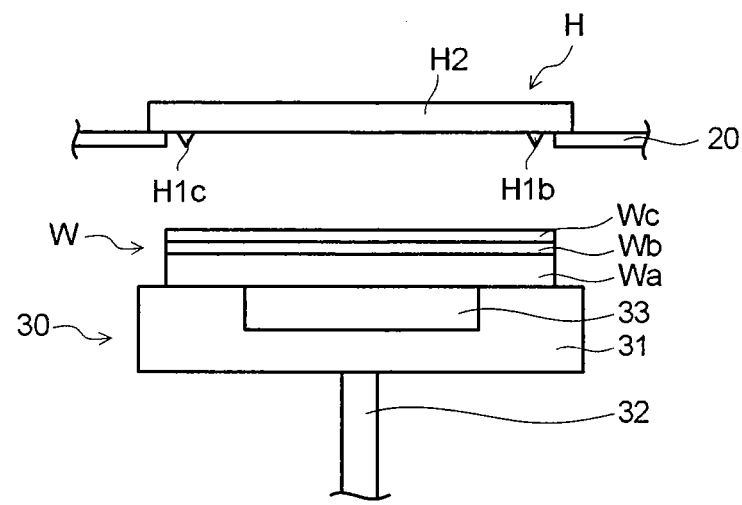
FIG. 3A and FIG. 3B are a side view and a plane view of a grounding body according to the first embodiment.
Figure 3B:
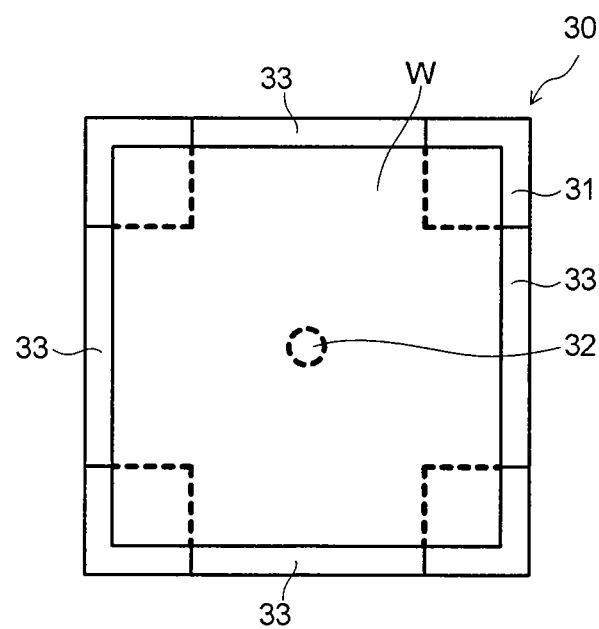

FIG. 3A is a side view of the grounding body housing chamber 330. FIG. 3B is a plane view of the grounding body housing chamber 330. Hereinafter, the structure of the grounding body housing chamber 330 will be described with reference to FIG. 3A and FIG. 3B.

As shown in FIG. 3A, inside of the grounding body housing chamber 330, a mounting shelf 20 where to place the grounding body H and a rotating mechanism 30 which rotates the mask substrate W are provided.

The rotating mechanism 30 includes a mounting table 31 where to place the mask substrate W and a rotating shaft 32 having one end connected to the mounting table 31. In the mounting table 31, escape grooves 33 allowing the end effector 342 of the transfer robot 340 to escape thereto are provided in four directions. Further, the rotating shaft 32 has another end connected to a not-shown motor and is structured to be capable of rotating the mounting table 31 by 90° at a time.

Figure 4:
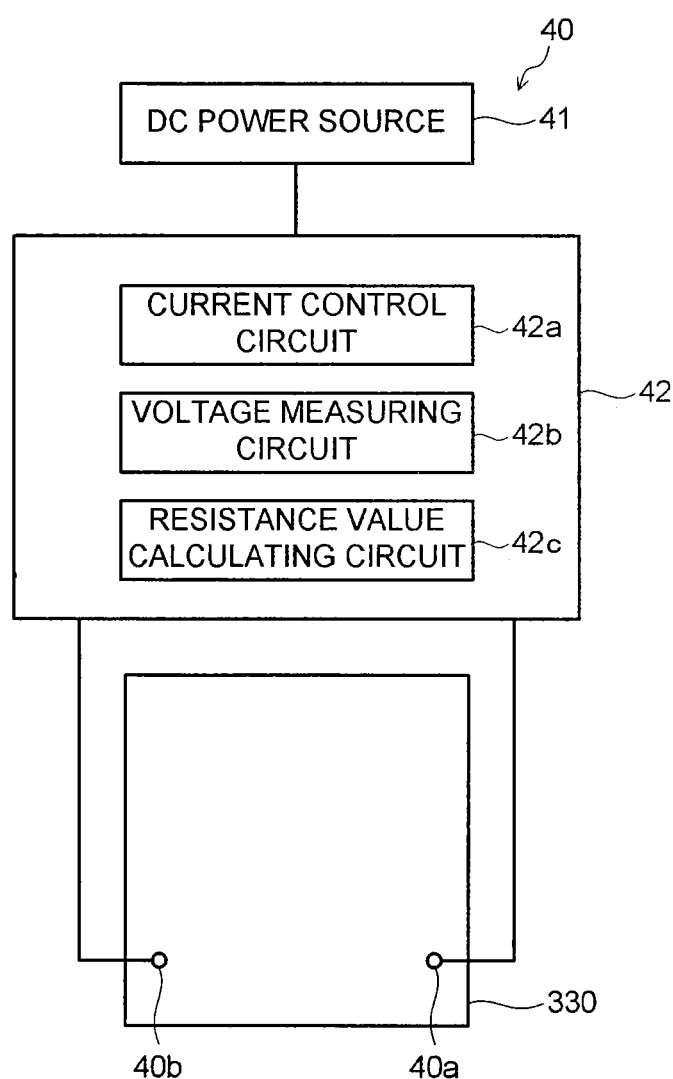
FIG. 4 is a block diagram of a resistance measuring mechanism according to the first embodiment.

FIG. 4 is a block diagram of the resistance measuring mechanism 40. As shown in FIG. 4, the resistance measuring mechanism 40 includes a DC power source 41 disposed outside the grounding body housing chamber 330 and a controller 42 connected to the DC power source 41. The controller 42 includes a current control circuit 42a, a voltage measuring circuit 42b, and a resistance value calculating circuit 42c and it measures an electric resistance between terminals 40a, 40b. The terminals 40a, 40b are provided in the grounding body housing chamber 330 and are connectable with the aforesaid grounding pins H1b, H1c of the grounding body H.

The resistance measuring mechanism 40 measures the contact resistance (resistance value) between the grounding body H and the mask substrate W while the grounding body H is set on the mask substrate W. Concretely, while the grounding body H is set on the mask substrate W, the current control circuit 42a supplies a current with a predetermined value between the terminals 40a, 40b, and the voltage measuring circuit 42b measures a voltage between the terminals 40a, 40b. Then, the resistance value calculating circuit 42c calculates the resistance value between the terminals 40a, 40b from the value of the current flowing between the terminals 40a, 40b and the measured voltage value. Note that when the resistance value is measured, the terminals 40a, 40b of the resistance measuring mechanism 40 and the grounding pins H1b, Inc of the grounding body H are in a connected state.

As described above, the grounding pin H1b or H1c is provided on the frame H2 via the insulator. Accordingly, the current applied by the current control circuit 42a flows between the terminals 40a, 40b via the grounding pins H1b, H1c and the light shielding film Wb of the mask substrate W. Here, connection resistance values between the terminals 40a, 40b and the grounding pins H1b, H1 are very small and almost negligible. Therefore, it is possible to measure the resistance value between the grounding pins H1b, H1c, concretely between the grounding pins H1b, H1c and the light shielding film Wb of the mask substrate W.

(Operation of Mask Drawing Apparatus 10)

Next, the operation of the mask drawing apparatus 10 will be described. Note that the operation of the mask drawing apparatus 10 described below is controlled by the control mechanism 600.

First, the container C housing the mask substrate W is placed on the mounting table 110. The transfer robot 120 takes out the mask substrate W from the container C. Next, the I/O chamber 200 is set to an atmospheric pressure and the gate valve G1 is opened.

After placing the mask substrate W in the I/O chamber 200, the transfer robot 120 retracts from the inside of the I/O chamber 200. Next, the gate valve G1 is closed. After the inside of the I/O chamber 200 is evacuated to a predetermined pressure, the gate valve G2 is opened. Next, the transfer robot 340 takes out the mask substrate W from the inside of the I/O chamber 200. Thereafter, the gate valve G2 is closed.

Next, the transfer robot 340 sets the grounding body H, which is placed on the mounting shelf 20 of the grounding body housing chamber 330, on the mask substrate W. The resistance measuring mechanism 40 of the grounding body housing chamber 330 measures the resistance value between the grounding body H and the mask substrate W. The control mechanism 600 stores, in the memory 602, the resistance value measured by the resistance measuring mechanism 40. Next, the transfer robot 340 returns the grounding body H to the mounting shelf 20 and places the mask substrate W on the mounting table 31 of the rotating mechanism 30.

Next, the rotating shaft 32 rotates by 90° to change the direction of the mask substrate W, which is placed on the mounting table 31, by 90°. The transfer robot 340 lifts up the mask substrate W on the mounting table 31 whose direction has been changed by 90° and sets the grounding body H on the mask substrate W. The resistance measuring mechanism 40 of the grounding body housing chamber 330 measures the resistance value between the grounding body H and the mask substrate W. The control mechanism 600 stores, in the memory 602, the resistance value measured by the resistance measuring mechanism 40.

The resistance measuring mechanism 40 and the control mechanism 600 repeat the above-described operations to measure the resistance value between the grounding body H and the mask substrate W every time the direction is changed by 90° and stores, in the memory 602, the resistance values between the grounding body H and the mask substrate W measured when the direction is 0°, 90°, 180°, 270°. Note that the direction in which the mask substrate W is rotated may either be clockwise (CW) or counter clockwise (CCW).

FIG. 5 shows an example of the measurement result. Table data shown in FIG. 5 is stored in the memory 602 of the control mechanism 600. The control mechanism 600 refers to the table data stored in the memory 602 to rotate the mask substrate W by an angle at which the measured resistance value is low. In the example shown in FIG. 5, the resistance value is lowest when the angle is 90°. Therefore, the control mechanism 600 rotates the rotating mechanism 30 so that the direction of the mask substrate W becomes 90°.

Next, after setting the grounding body H on the mask substrate W, the transfer robot 340 transfers the mask substrate W to the alignment chamber 320. In the alignment chamber 320, the mask substrate W is aligned. When the alignment is finished, the gate valve G3 is opened, and the transfer robot 340 places the mask substrate W on the X-Y stage 420 in the R chamber 400. After the transfer robot 340 retracts from the inside of the R chamber 400, the gate valve G3 is closed.

The drive mechanisms 430A, 430B move the X-Y stage 420 to a predetermined position. Next, the electron beam is irradiated to the mask substrate W from the electron beam column 500.

The drive mechanisms 430A, 430B move the X-Y stage 420 in the X direction and the Y direction, and the electron beam B is irradiated to the mask substrate W except its peripheral end portion to draw a desired pattern.

When the drawing on the mask substrate W is finished, the drive mechanisms 430A, 430B move the X-Y stage 420 to a predetermined position. Next, the gate valve G3 is opened. The transfer robot 340 takes out the mask substrate W from the W chamber 400. Next, the gate valve G3 is closed. The transfer robot 340 transfers the mask substrate W into the grounding body housing chamber 330 and houses the grounding body H in the grounding body housing chamber 330 in a procedure reverse to that for setting the grounding body H on the mask substrate W.

Next, the gate valve G2 is opened, and after placing the mask substrate W in the I/O chamber 200, the transfer robot 340 retracts from the inside of the I/O chamber 200. Next, the gate valve G2 is closed. After the vent gas is supplied from the gas supply system 220 to increase the pressure in the I/O chamber 200 to the atmospheric pressure, the gate valve G1 is opened.

The transfer robot 120 takes out the mask substrate W from the inside of the I/O chamber 200 and retracts from the inside of the I/O chamber 200. Next, the gate valve G1 is closed. Next, the transfer robot 120 houses the mask substrate W into the container C.

As described above, in the first embodiment, the rotating mechanism 30 which rotates the mask substrate W is provided in the grounding body housing chamber 330, and while the grounding body H is set on the mask substrate W, the resistance value is measured every time the direction of the mask substrate W is changed by 90°. Then, the grounding body H is set on the mask substrate W which has been rotated in the direction (to the angle) where the resistance value is lowest, and the drawing by the electron beam is performed.

Therefore, it is possible to reduce the electric charges accumulating on the mask substrate W to effectively reduce the bending of the trajectory of the electron beam and the occurrence of a blur due to the diffusion of the electron beam. As a result, it is possible to more accurately draw a desired pattern on the mask substrate W.

Second Embodiment

In a mask drawing apparatus, an unexpected increase of a resistance value between a mask substrate and a grounding body sometimes occurs. There are various possible factors that cause such phenomenon, such as that the grounding body is set on the mask substrate in an inclined state, that grounding pins of the grounding body do not reach a light shielding film without piercing through a resist layer of the mask substrate, and so on.

This phenomenon is liable to occur even when the grounding body is set at the same place of the mask substrate, and therefore, the method of the first embodiment in which the resistance value is measure every time the mask substrate W is rotated by 90° and the grounding body is set on the mask substrate which has rotated to the direction (angle) where the resistance value becomes lowest has a difficulty in preventing the phenomenon. For example, a possibility that the unexpected increase of the resistance value occurs in all the four directions (0°, 90°, 180°, 270°) is very low. However, when this occurs, there is a possibility that the electric charges accumulate on the mask substrate even if the grounding body is set on the mask substrate which has been rotated to the direction where the resistance value is lowest.

In a second embodiment, an embodiment will be described that the resistance value is measured a plurality of times in the same direction (angle) and a threshold value is calculated from these resistance values, then the direction for setting the grounding body on the mask substrate is decided based on the calculated threshold value. In the second embodiment which will be hereinafter described, the structure of a mask drawing apparatus is the same as the mask drawing apparatus 10 according to the first embodiment described with reference to FIG. 1 to FIG. 4. Therefore, the operation of the mask drawing apparatus 10 according to the second embodiment will be described with reference to FIG. 1 to FIG. 4.

(Operation of Mask Drawing Apparatus)

Next, the operation of the mask drawing apparatus 10 will be described. Note that the operation of the mask drawing apparatus 10 described below is controlled by the control mechanism 600.

First, the container C housing the mask substrate W is placed on the mounting table 110. The transfer robot 120 takes out the mask substrate W from the container C. Next, the I/O chamber 200 is set to an atmospheric pressure, and the gate valve G1 is opened.

After placing the mask substrate W in the I/O chamber 200, the transfer robot 120 retracts from the inside of the I/O chamber 200. Next, the gate valve G1 is closed. After the inside of the I/O chamber 200 is evacuated to a predetermined pressure, the gate valve G2 is opened. Next, the transfer robot 340 takes out the mask substrate W from the inside of the I/O chamber 200. Thereafter, the gate valve G2 is closed.

Next, the transfer robot 340 transfers the mask substrate W into the grounding body housing chamber 330 and sets the grounding body H, which is placed on the mounting shelf 20 of the grounding body housing chamber 330, on the mask substrate W. The resistance measuring mechanism 40 of the grounding body housing chamber 330 measures a resistance value between the grounding body H and the mask substrate W. The control mechanism 600 stores, in the memory 602, the resistance value measured by the resistance measuring mechanism 40.

Next, the transfer robot 340 returns the grounding body H to the mounting shelf 20 and sets the grounding body H on the mask substrate W again. The resistance measuring mechanism 40 measures the resistance value between the grounding body H and the mask substrate W. That is, in this embodiment, the resistance values for the same direction are measured without the mask substrate W being rotated. The resistance measuring mechanism 40 and the control mechanism 600 perform the above-described operations a plurality of times and stores the measured resistance values in the memory 602.

FIG. 6 shows an example of the measurement result. In the memory 602 of the control mechanism 600, table data shown in FIG. 6 is stored. In the example shown in FIG. 6, the resistance value is measured five times, and the resistance values measured the second time and the fifth time unexpectedly increase to abnormal values. The control mechanism 600 refers to the table data stored in the memory 602, and calculates an average value (threshold value) of the measured resistance values.

Next, the control mechanism 600 rotates the rotating mechanism 300 by 90° to measure the resistance value. The control mechanism 600 determines whether or not the measured resistance value is a value within a predetermined range with respect to the average value (threshold value) (for example, +5% or less from the average value).

Note that the number of times the resistance value is measured is preferably about five to about ten. When the number of the measurement times is less than five, the sample number (n number) is too small and accuracy of the calculated average value becomes low. On the other hand, the number of the measurement times is over ten, the light shielding film Wb of the mask substrate W is liable to be damaged by the grounding pins H1a to H1c.

When the measured resistance value is a value within the predetermined range with respect to the average value (threshold value) (for example, +5% or less from the average value), robot 340 transfers the mask substrate W to the alignment chamber 320. In the alignment chamber 320, the mask substrate W is aligned.

On the other hand, when the measured resistance value is not within the predetermined range with respect to the calculated average value (threshold value) (for example, +5% or less from the average value), the control mechanism 600 measures the resistance value while rotating the mask substrate W by 90° each time until the resistance value becomes a value within the predetermined range with respect to the average value (threshold value (for example, +5% or less from the average value).

Then, when the measured resistance value becomes a value within the predetermined range with respect to the average value (threshold value) (for example, +5% or less from the average value), the transfer robot 340 transfers the mask substrate W to the alignment chamber 320. In the alignment chamber 320, the mask substrate W is aligned. Note that, when none of the average values of the resistance values which are measured when the mask substrate W is set in the four directions becomes a value within the predetermined range, an error may be displayed to stop the drawing operation or to accept the handling by a user.

Note that +5% or less from the average value is an example for deciding the predetermined range. If the trajectory of the electron beam does not bend or the electron beam does not diffuse, a width from the average value may be arbitrarily changed. For example, the predetermined range may be +10% or less or +3σ from the average value. Further, the direction in which the mask substrate W is rotated may be either clockwise (CW) or counter clockwise (CCW).

After the alignment is finished, the gate valve G3 is opened, and the transfer robot 340 places the mask substrate W onto the X-Y stage 420 in the W chamber 400. After the transfer robot 340 retracts from the inside of the W chamber 400, the gate valve G3 is closed.

The drive mechanisms 930A, 430B move the X-Y stage 420 to a predetermined position. Next, an electron beam is irradiated to the mask substrate W from the electron beam column 500. The drive mechanisms 430A, 430B move the X-Y stage 420 in the X direction and the Y direction, and the electron beam B is irradiated to the mask substrate W except its peripheral end portion to draw a desired pattern.

When the drawing on the mask substrate W is finished, the drive mechanisms 430A, 430B move the X-Y stage 420 to a predetermined position. Next, the gate valve G3 is opened. The transfer robot 340 takes out the mask substrate W from the W chamber 400. Next, the gate valve G3 is closed. The transfer robot 340 transfers the mask substrate W into the grounding body housing chamber 330 and houses the grounding body H in the grounding body housing chamber 330 in a procedure reverse to that for setting the grounding body H on the mask substrate W.

Next, the gate valve G2 is opened, and after placing the mask substrate W in the I/O chamber 200, the transfer robot 340 retracts from the inside of the I/O chamber 200. Next, the gate valve G2 is closed. The vent gas is supplied from the gas supply system 220, and after a pressure in the I/O chamber 200 is increased up to an atmospheric pressure, the gate valve G1 is opened.

The transfer robot 120 takes out the mask substrate W from the inside of the I/O chamber 200 and retracts from the inside of the I/O chamber 200. Next, the gate valve G1 is closed. Next, the transfer robot 120 houses the mask substrate W in the container C.

As described above, in the second embodiment, the resistance value is measured a plurality of times while the mask substrate W is set in the same direction, and the threshold value (average value) is calculated from the measured resistance values. Then, the direction of the mask substrate W is changed, and the resistance value is measured, and when the resistance value is within the predetermined range with respect to the calculated threshold value (for example, the threshold value +5% or less), the drawing on the mask substrate W is performed.

Therefore, it is possible to prevent the drawing on the mask substrate W while the resistance value between the mask substrate W and the grounding body H is unexpectedly high. The other effects are the same as the effects of the mask drawing apparatus 10 according to the first embodiment.

Modification Example of Second Embodiment

Incidentally, in the second embodiment, the resistance value is measured a plurality of times while the mask substrate W is set in the same direction and the threshold value (average value) is calculated from the measured resistance values, but the threshold value may be stored in the memory 602 of the control mechanism 600 in advance.

A sheet resistance of the mask substrate W is desirably 30 kΩ or less. Therefore, when the measured resistance value of the mask substrate W is 30 kΩ (sheet resistance equivalent) or less, the drawing on the mask substrate W is started, and when the resistance value is over 30 kΩ (sheet resistance equivalent), the mask substrate W is rotated by 90° each time by the rotating mechanism 30, and the resistance value of the mask substrate W is measured, and the drawing on the mask substrate W may be performed when the mask substrate W is set in the direction (angle) where the resistance value becomes 30 kΩ or less.

Incidentally, there may be a case where the sheet resistance differs depending on the kind of the mask substrate W. For example, there may be a case where a thickness of the light shielding film differs depending on the kind (type) of the mask substrate W. In this case, the threshold value for each kind of the mask substrate W may be stored.

Other Embodiments

While certain embodiments have been described, these embodiments have been presented by way of example only, and are not intended to limit the scope of the inventions. Indeed, the novel embodiment described herein may be embodiment in a variety of other forms; furthermore, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A mask drawing method, comprising:
   disposing a grounding body provided with a grounding pin at a plurality of different places on a mask substrate to measure resistance values at the plural positions;
   disposing the grounding body at a position where the resistance value is lowest, among the plural positions where the resistance values are measured; and
   irradiating an electron beam to the mask substrate to draw a desired pattern.

2. A mask drawing method, comprising:
   repeating to dispose a grounding body provided with a grounding pin at different positions on a mask substrate to measure resistance values at the positions where the grounding body is disposed, until the measured resistance value becomes within a predetermined range;
   disposing the grounding body at a position where the measured resistance value has become within the predetermined range; and
   irradiating an electron beam to the mask substrate to draw a desired pattern.

3. The method according to claim 2,
   wherein measuring the resistance value while the grounding body is disposed at the same position on the mask substrate is repeated a plurality of times, and the predetermined range is calculated based on the plural measured resistance values.

4. The method according to claim 3,
   wherein the predetermined range is calculated based on an average value of the plural resistance values.

5. A mask drawing apparatus, comprising:
   a processing chamber having a stage where to place a mask substrate;
   an electron beam irradiator provided on an upper portion of the processing chamber and having an electron beam irradiator which irradiates an electron beam to the mask substrate placed on the stage;
   a load lock chamber via which the mask substrate is loaded/unloaded; and
   a transfer chamber provided between the processing chamber and the load lock chamber and having a transfer robot which transfers the mask substrate onto the stage from the load lock chamber and a disposition chamber where a grounding body provided with a grounding pin is disposed on the mask substrate,
   wherein a rotating mechanism which rotates the mask substrate horizontally is provided in the disposition chamber.

* * * * *